(12) United States Patent
Von Kaenel et al.

(10) Patent No.: US 7,588,954 B2
(45) Date of Patent: Sep. 15, 2009

(54) INGAAS/GAAS LASERS ON SILICON PRODUCED BY LEPECVD AND MOCVD

(75) Inventors: Hans Von Kaenel, Zurich (CH); Isabelle Sagnes, Paris (FR); Guillaume Jacques Saint-Girons, Paris (FR); Sophie Bouchoule, Le Kremlin-Bicetre (FR)

(73) Assignee: Epispeed S.A., Zug (CH)

( * ) Notice: Subject to any disclaimer, the term of this patent is extended or adjusted under 35 U.S.C. 154(b) by 153 days.

(21) Appl. No.: 10/570,921

(22) PCT Filed: Sep. 4, 2004

(86) PCT No.: PCT/EP2004/009873
§ 371 (c)(1),
(2), (4) Date: Jan. 15, 2007

(87) PCT Pub. No.: WO2005/025019
PCT Pub. Date: Mar. 17, 2005

(65) Prior Publication Data
US 2007/0164311 A1    Jul. 19, 2007

(30) Foreign Application Priority Data
Sep. 5, 2003    (EP) .................................. 03020169

(51) Int. Cl.
*H01L 21/00* (2006.01)
(52) U.S. Cl. ............................. 438/31; 438/21; 438/29; 257/E21.404
(58) Field of Classification Search .................. 438/22, 438/29, 31, 46, 47; 257/E21.404
See application file for complete search history.

(56) References Cited

U.S. PATENT DOCUMENTS 6,454,855 B1    9/2002    Von Kaenel et al.
6,906,400 B2*   6/2005    Delhougne et al. .......... 257/616

(Continued)

FOREIGN PATENT DOCUMENTS

| EP | 988407 | 12/1998 |
|---|---|---|
| EP | 1 315 199 | 5/2003 |
| WO | WO 03/044839 | 5/2003 |

OTHER PUBLICATIONS

Fitzgerald et al., Totally relaxed GeXSi1-X layers with low threading dislocation densities grown on Si substrates, Appl. Phys. Lett., vol. 59, p. 811-13 (1991).

(Continued)

*Primary Examiner*—Charles D. Garber
*Assistant Examiner*—Seahvosh J Nikmanesh
(74) *Attorney, Agent, or Firm*—MOETTELI & Associés SàRL

(57) ABSTRACT

Method for making an InGaAs/GaAs quantum well laser (10) on a Silicon substrate (15.1). The method comprises the steps:

Formation of a virtual Germanium substrate (15) on the Silicon substrate (15.1) by means of a low-energy plasma-enhanced chemical vapour deposition (LEPECVD). The virtual Germanium substrate (15) comprises a pure Germanium layer (15.3).

Formation of a Gallium Arsenide structure on the virtual Germanium substrate (15) by means of a metal organic chemical vapour deposition process. The metal organic chemical vapour deposition process comprises the steps:

formation of a first Gallium Arsenide layer (16) on the virtual Germanium substrate (15) at a first substrate temperature ($T_{s1}$), formation of a second Gallium Arsenide waveguide layer (17) at a second substrate temperature ($T_{s2}$), the second substrate temperature ($T_{s2}$) being higher than the first substrate temperature ($T_{s1}$) and the first Gallium Arsenide layer (16; 21) being thinner than the second Gallium Arsenide layer (17), formation of an active laser structure comprising a Gallium Arsenide waveguide layer (12) embedding a quantum well (11).

20 Claims, 2 Drawing Sheets

U.S. PATENT DOCUMENTS

| | | | | |
|---|---|---|---|---|
| 7,375,385 | B2* | 5/2008 | Westhoff et al. | 257/191 |
| 2002/0004253 | A1* | 1/2002 | Ooi et al. | 438/31 |
| 2004/0079954 | A1* | 4/2004 | Taylor et al. | 257/89 |
| 2004/0200523 | A1* | 10/2004 | King et al. | 136/262 |
| 2006/0157732 | A1* | 7/2006 | Von Kaenel et al. | 257/190 |
| 2007/0231488 | A1* | 10/2007 | Von Kaenel | 427/255.15 |
| 2008/0152903 | A1* | 6/2008 | Von Kaenel | 428/337 |

OTHER PUBLICATIONS

Currie et al., Controlling threading dislocation densities in Ge on Si using graded SiGe layers and chemical-mechanical polishing, Appl. Phys. Lett., vol. 72, p. 1718-20(1998).

Ting et al., Metal-organic chemical vapor deposition of single domain GaAs on Ge/GeXSi1-X/Si and Ge substrates, J. Appl. Phys., vol. 87, p. 2618-28 (2000).

Yang et al., Comparison of luminescent efficiency of InGaAs quantum well structures grown on Si, GaAs, Ge, and SiGe virtual substrate, J. Appl. Phys., vol. 93, p. 5095-102 (2003).

Groenert et al., Improved room-temperature continuous wave GaAs/AlGaAs an InGaAs/GaAs/AlGaAs lasers fabricated on Si substrates via relaxed graded GeXSi1-X buffer layers, J. Vac. Sci. Technol., vol. B 21, p. 1064-69 (2003).

* cited by examiner

INGAAS/GAAS LASERS ON SILICON PRODUCED BY LEPECVD AND MOCVD

This application is the US National Stage of PCT/EP04/09873, entitled INGAAS/GAAS LASERS ON SILICON PRODUCED BY LEPECVD AND MOCVD, filed Sep. 4, 2004, which claims priority to European Application 03020169.3, filed Sep. 5, 2003.

The present invention concerns methods for making lasers, in particular InGaAs/GaAs lasers, on top of a Silicon substrate, where the laser's active region comprises a strained semiconductor layer.

STATE OF THE ART

It is known in the art to grow Gallium Arsenide (GaAs) on Silicon (Si) by means of an intermediate Silicon Germanium (SiGe) buffer layer. The concept of graded SiGe buffer layers was invented in 1991 by Fitzgerald et al. (cf. F. A. Fitzgerald, Y.-H. Xie, M. L. Green, D. Brasen, A. R. Kortan, J. Michel, Y.-J Mii, and B. E. Weir, Appl. Phys. Lett. 58, 811 (1991)). Such graded SiGe buffer layers are used as so-called virtual substrates (VS) for applications in the area of high-speed electronics and for the integration of compound semiconductors, such as GaAs, on Si.

In the graded buffer approach, the Ge concentration x in a $Si_{1-x}Ge_x$ alloy is raised in a linear or step-wise fashion from zero up to some final value $X_f$. In this way, dislocations are distributed in a larger volume compared to a SiGe film with constant composition, where they reside basically at the interface. As a result, threading dislocation (TD) arms become more mobile, long misfit segments are formed, ideally across the whole wafer, and the density of TDs piercing the active layers of devices formed on the VS, and spoiling their performance is reduced.

For the integration of GaAs on Si the $Si_{1-x}Ge_x$ VS has to be graded to pure Ge (i.e., x=1), because of the small lattice mismatch of 0.07% between GaAs and Ge. Moreover, in order to suppress the formation of antiphase domains (APDs) in a GaAs film subsequently grown on the VS, the clean surface has to be single-domain. This can be achieved by appropriate substrate misorientation, typically on the order of 6° towards the [110] direction and sufficiently high substrate temperatures during GaAs growth (cf. S. M. Ting and E. A. Fitzgerald, J. Appl. Phys. 87, 2618 (2000)).

The conventional way of fabricating VSs is by means of chemical vapour deposition (CVD). Linearly graded VSs are, however, many microns thick because of the requirement of low grading rates (typically around 10%/µm to assure low TD densities). Conventional CVD techniques are therefore either too slow or require high substrate temperatures for such VSs to be grown. At high substrate temperatures the surface roughness of the VS becomes, however, unacceptably high such that additional processing steps, such as chemical-mechanical polishing (CMP), are required (cf. M. T. Currie, S. B. Samavedam, T. A. Langdo, C. W. Leitz, and E. A. Fitzgerald, Appl. Phys. Lett. 72, 1718 (1998)).

There does, however, exist a fast deposition process for low temperature SiGe epitaxy. It is called low-energy plasma-enhanced chemical vapour deposition (LEPECVD), and allows growth time and material consumption to be minimized. The basic process, applied only to Si homoepitaxy and strained-layer SiGe/Si heteroepitaxy, has been patented in the US (cf. U.S. Pat. No. 6,454,855 B1, currently assigned to Unaxis Trading AG, Switzerland), and corresponding patent applications are pending in Europe (cf. EP 988407-A1) and Japan (cf. JP2002504061T). For the application of LEPECVD to p-MODFETs a European patent application (cf. publication number EP 1315199-A1) and a PCT application (cf. publication number WO03/044839) have been filed. These applications are currently assigned to ETH Zürich, Switzerland.

The monolithic integration of lasers on Si substrates via an intermediate layer for lattice matching is extremely demanding because of the required low defect densities. The demands are even higher when strained layers are used for the active channels of the laser since too high a density of TDs in the VS may easily lead to misfit dislocations at the active channel/GaAs interface. Among the only two reports to date of lasers fabricated on VS SiGe substrates on Si the first one applies therefore to an unstrained AlGaAs/GaAs structure. This quantum well laser permitted continuous room-temperature operation at a wavelength of 858 nm (cf. M. E. Groenert, C. W. Leitz, A. J. Pitera, V. Yang, H. Lee, R. J. Ram, and E. A. Fitzgerald, J. Appl. Phys. 93, 362 (2003)). In the second report a strained InGaAs quantum well is described (M. Groenert et al., J. Vac. Sci. Technol. B 21, 1064 (2003)), which, however, had to be kept extremely thin, namely 5 nm, such that laser action was obtained only at a wavelength of 890 nm.

In these approaches, VSs grown by CVD were used, requiring a CMP step to reduce TD density and surface roughness of the VSs. Subsequently, metal organic chemical vapour deposition (MOCVD) was used to grow the GaAs and AlGaAs layers of the laser. In order to suppress the formation of APDs, the MOCVD reactor had to be operated at temperatures of 700-750° C. In order to limit significant autodoping of the GaAs and AlGaAs layers of the laser by Ge, these authors had to use a complicated procedure, including the removal of Ge from the backside of the wafer.

It is an object of the present invention to provide an improved process for the fabrication of lasers on top of a Si substrate, where the laser's active region comprises a strained semiconductor layer.

SUMMARY OF THE INVENTION

The process, according to the present invention, allows the fabrication of lasers on top of a Si substrate, where the laser's active region comprises a strained semiconductor layer. The process incorporates a combination of the following techniques:

LEPECVD for the fast fabrication of a virtual Ge substrate on a Si substrate. For this process three variants are possible: Variant I: Growth of linearly graded SiGe buffer layer with grading rate below 10%/µm, including a pure Ge cap. The Ge cap layer has a thickness between 0.5 µm and 2 µm thick, and is preferably 1 µm thick.

Variant II: Growth of a linearly graded SiGe buffer layer with a grading rate between 10-300%/µm, and preferably about 200%/µm, followed by a pure Ge cap. The Ge cap layer has a thickness between 0.5 µm and 5 µm, and is preferably about 2 µm thick.

Variant III: Growth of a pure Ge layer directly on Si of a typical thickness between 0.5 and 5 µm, and preferably between 1 µm and 2 µm.

GaAs growth by MOCVD on the Ge VS. According to the present invention, the GaAs growth has been performed in two steps as follows (1) First step at low substrate temperatures $T_s$ for the formation of a first GaAs layer. A nucleation step involving atomic layer epitaxy at low substrate temperatures $T_s$ (LT-ALE) can be carried out as first step.

(2) Conventional growth of GaAs at higher temperatures $T_s$

Growth of an InGaAs quantum well laser structure or an InGaAs/AlGaAs/GaAs quantum well laser structure.

Various advantageous methods are claimed in the dependent claims 2 through 11.

The new process, according to the present invention, offers several advantages. In comparison to previous work (cf. M. E. Groenert, C. W. Leitz, A. J. Pitera, V. Yang, H. Lee, R. J. Ram, and E. A. Fitzgerald, J. Appl. Phys. 93, 362 (2003)) the new process has the following advantages:

The VS fabrication is much faster due to the high growth rates of LEPECVD of up to 10 nm/s and the absence of any chemical mechanical polishing step;

In LEPECVD the unwanted deposition of Ge on the backside of the Si wafer is negligible in contrast to UHV-CVD. Together with the LT-ALE step, this leads to negligible autodoping in the MOCVD reactor;

Misfit dislocations at the laser's InGaAs/GaAs interface are avoided in this process, enabling laser action in compressively strained InGaAs quantum well (QW) structures.

BRIEF DESCRIPTION OF THE DRAWINGS

For a more complete description of the present invention and for further objects and advantages thereof, reference is made to the following description, taken in conjunction with the accompanying drawings, in which.

DETAILED DESCRIPTION

Figure 1:
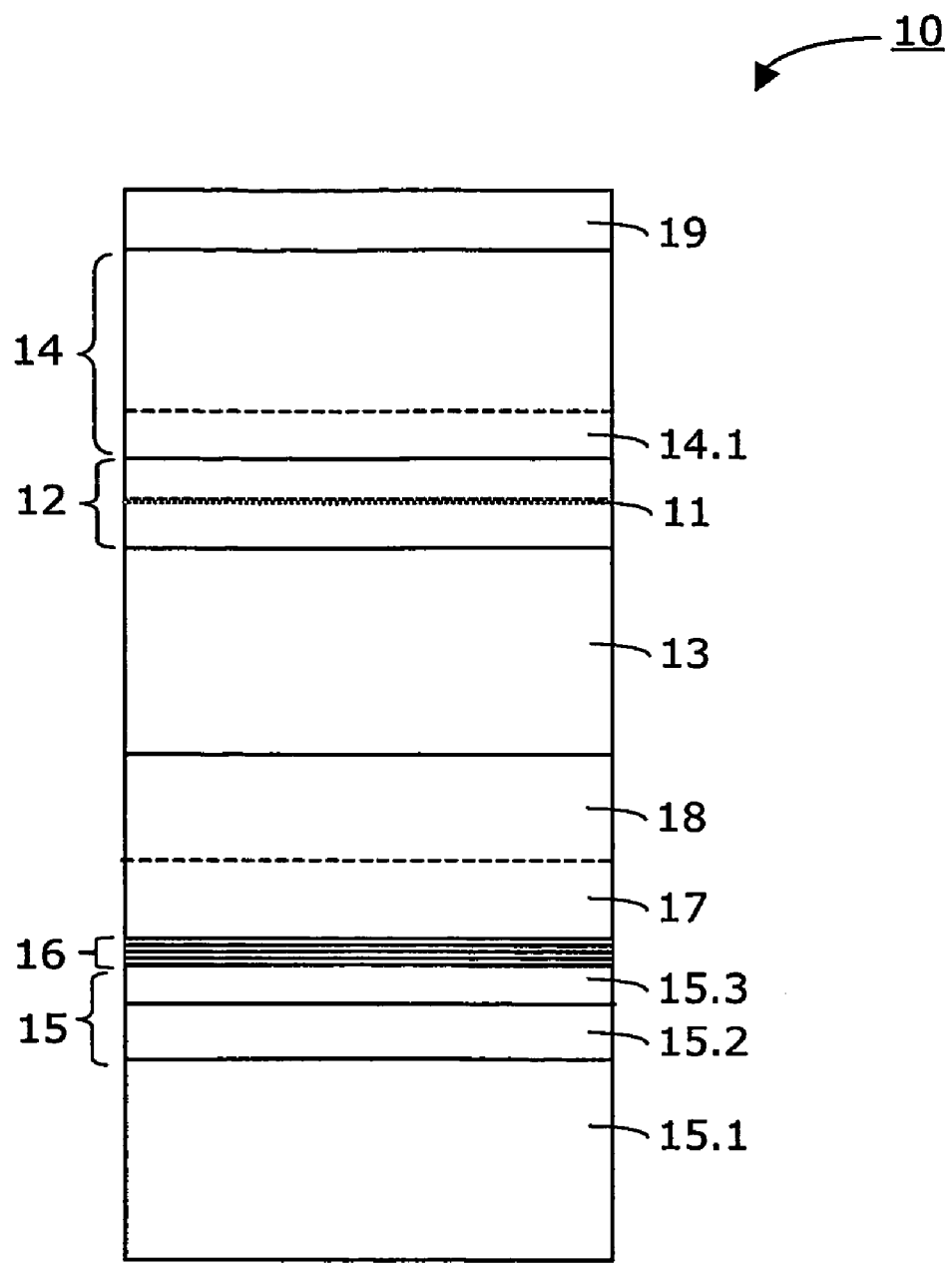
FIG. 1 is a schematic cross-section of a strained-layer InGaAs/GaAs laser structure, according to the present invention.

FIG. 1 shows a schematic layout of a first laser structure 10, according to the present invention. The laser structure 10 comprises in the present example the following layers, from the bottom up:

- a virtual substrate (VS) comprising a Si substrate 15.1, graded SiGe buffer 15.2, and a pure Ge cap 15.3,
- an Arsenic/gallium super-lattice (LT-ALE) 16 (first Gallium Arsenide layer)
- an undoped GaAs buffer layer 17 (second Gallium Arsenide layer),
- an n⁺-doped GaAs contact layer 18,
- an n-doped $Al_{0.35}Ga_{0.65}As$ cladding layer 13,
- an undoped GaAs waveguide layer 12 embedding a strained InGaAs quantum well (QW) 11,
- a p-doped $Al_{0.35}Ga_{0.65}As$ cladding layer 14 comprising a thin undoped $Al_{0.35}Ga_{0.65}As$ section 14.1,
- a p⁺⁺-doped GaAs contact layer 19.

The active region of the laser structure 10 comprises a strained InGaAs quantum well (QW) 11 embedded in a 290 nm wide undoped GaAs waveguide layer 12. The active region of the laser structure 10 is sandwiched between an n-doped $Al_{0.35}Ga_{0.65}As$ cladding layer 13 and a p-doped $Al_{0.35}Ga_{0.65}As$ cladding layer 14, the role of which is to minimize mode losses in the absorbing Ge VS 15. The first 200 nm (cf. reference number 14.1) of the upper AlGaAs cladding layer 14 next to the undoped GaAs waveguide 12 are undoped as well, in order to reduce optical losses by free carrier absorption.

Further details of a first embodiment is given in the following table:

| Reference Number of Layer | Material | Doping | Thickness Range | Typical Thickness |
|---|---|---|---|---|
| 15.1 | Si-wafer [001]-oriented, 6 degree off | — | 100-1000 μm | ~200 μm after polishing |
| 15.2 | SiGe (graded) | — | 0.3-14 μm | ~5 μm |
| 15.3 | Ge (pure) | — | 0.5-5 μm | 1 μm |
| 16 | As/Ga | doped or undoped | 1-3 nm | 2 nm |
| 17 | GaAs | doped or undoped | 0.2-2 μm | ~0.7 μm |
| 18 | GaAs | n⁺-doped, Si $7 \cdot 10^{18}$ cm⁻³ | 0.2-2 μm | ~0.7 μm |
| 13 | $Al_{0.35}Ga_{0.65}As$ | n-doped, Si $2 \cdot 10^{18}$ cm⁻³ | 1-5 μm | ~2 μm |
| 12 | GaAs | undoped | 0.2-0.4 μm | ~0.29 μm |
| 11 | InGaAs (strained) In concentration between 20-25% | — | 5-15 nm | ~10 nm |
| 14.1 | $Al_{0.35}Ga_{0.65}As$ | undoped | 0.1-0.3 μm | ~0.2 μm |
| 14 | $Al_{0.35}Ga_{0.65}As$ | p-doped, Zn $5 \cdot 10^{17}$ cm⁻³ | 1-5 μm | ~2 μm |
| 19 | GaAs | P⁺⁺-doped, Zn $1 \cdot 10^{19}$ cm⁻³ | 0.1-0.3 μm | ~0.15 μm |

Figure 2:
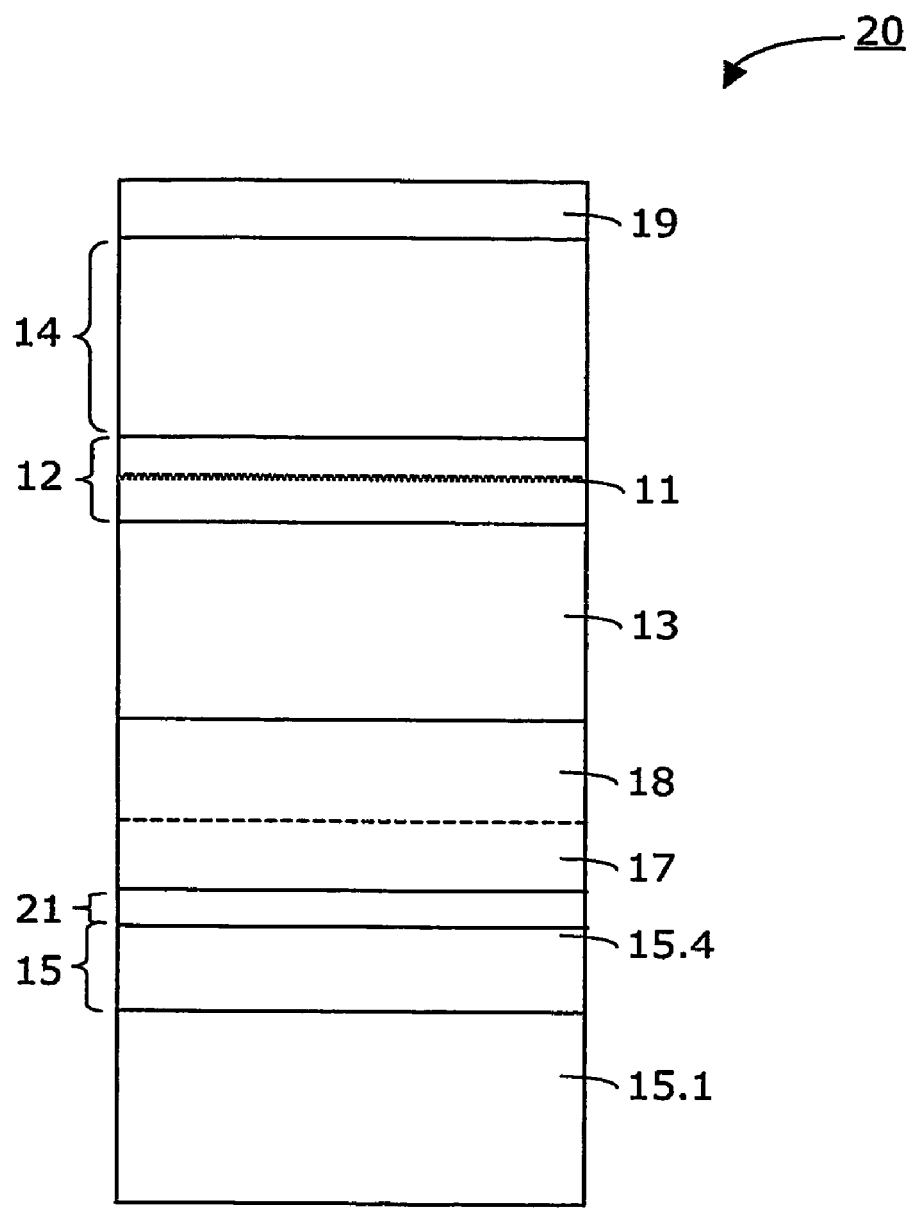
FIG. 2 is a schematic cross-section of another strained-layer InGaAs/GaAs laser structure, according to the present invention.

Another laser structure 20, according to the present invention, is depicted in FIG. 2. The corresponding details are given in the following table:

| Reference Number of Layer | Material | Doping | Thickness Range | Typical Thickness |
|---|---|---|---|---|
| 15.1 | Si-wafer | — | 100-1000 μm | ~300 μm after polishing |
| 15.4 | Ge (pure) | — | 0.5-5 μm | ~2 μm |
| 21 | GaAs (formed at $T_{s1}$) | doped or undoped | 1-3 nm | 2 nm |
| 17 | GaAs (formed at $T_{s2}$) | doped or undoped | 0.2-2 μm | ~0.2 μm |
| 18 | GaAs | n⁺-doped, Si $7 \cdot 10^{18}$ cm⁻³ | 0.2-2 μm | ~0.9 μm |
| 13 | $Al_{0.8}Ga_{0.2}As$ | n-doped, Si $2 \cdot 10^{18}$ cm⁻³ | 1-5 μm | ~2.5 μm |
| 12 | GaAs | undoped | 50-200 nm | ~100 nm |
| 11 | InGaAs (strained) In concentration between 20-25% | — | 5-15 nm | ~10 nm |
| 14 | $Al_{0.8}Ga_{0.2}As$ | p-doped, Zn $5 \cdot 10^{17}$ cm⁻³ | 1-5 μm | ~2.5 μm |
| 19 | GaAs | P⁺⁺-doped, Zn $1 \cdot 10^{19}$ cm⁻³ | 0.1-0.3 μm | ~0.2 μm |

The respective layers of the lasers can be optimized as a function of the emitted power, the number of optical modes wanted, and so forth.

Instead of broad area lasers, like the ones illustrated in FIGS. 1 and 2, one can also grow vertical cavity lasers (VCSEL), according to the present invention.

A method, according to the present invention, for making an InGaAs/GaAs quantum well laser on a Silicon substrate comprises the following steps:

formation of a virtual Germanium substrate 15 on a Silicon substrate 15.1 by means of a low-energy plasma-enhanced chemical vapour deposition (LEPECVD), whereby the virtual Germanium substrate 15 comprises a pure Germanium layer 15.3 or 15.4, formation of a Gallium Arsenide laser structure on the virtual Germanium substrate 15 by means of a multi-step metal organic chemical vapour deposition process, whereby in an initial step at a first substrate temperature (Ts1) a first Gallium Arsenide layer 16 or 21 is formed right on top of the virtual Germanium substrate 15. In a subsequent step a Gallium Arsenide buffer layer 17 is formed at a second substrate temperature (Ts2). The second substrate temperature (Ts2) is higher than the first substrate temperature (Ts1) and the first Gallium Arsenide layer 16 or 21 is thinner than the Gallium Arsenide buffer layer 17, formation of an active laser region comprising a quantum well 11 within a Gallium Arsenide waveguide layer 12.

As stated in connection with the first embodiment, the virtual Germanium substrate 15 may comprise a linearly graded Silicon Germanium buffer layer 15.2 with grading rate between 5 and 300%/μm. This linearly graded Silicon Germanium buffer layer 15.2 is formed underneath the pure Germanium layer 15.3. Preferably, the pure Germanium layer 15.3 serves as cap layer having a thickness between 0.5 μm and 5 μm, and preferably about 1 μm.

The initial step for the formation of the first Gallium Arsenide layer 16 may be an atomic layer epitaxy step in which case the first Gallium Arsenide layer 16 is an Arsenic/Gallium super-lattice.

As stated in connection with the second embodiment, the virtual Germanium substrate 15 may comprise a pure Germanium layer 15.4 being formed directly on the Silicon substrate 15.1. The pure Germanium layer 15.4 has a thickness between 0.5 μm and 5 μm, and preferably between 1 μm and 2 μm.

Preferably, the second Gallium Arsenide waveguide layer 17 is undoped and has a thickness between 0.2-2 μm. It may have a thickness of about 1 μm, for instance.

The Gallium Arsenide waveguide layer 12 may be undoped. It has a thickness between 0.2-0.4 μm, and preferably about 0.29 μm.

Several metal organic chemical vapour deposition process steps are carried out when forming the active laser structure. Advantageous results are achieved if the active laser structure comprises an InGaAs quantum well laser structure. Preferably, the active laser structure comprises an InGaAs/AlGaAs/GaAs quantum well laser structure with a compressively strained InGaAs quantum well 11.

According to the present invention, the low-energy plasma-enhanced chemical vapour deposition (LEPECVD) has a growth rate of up to 10 nm/s.

The laser structures 10 and 20 are well suited as broad area lasers, for example.

The laser structures 10 or 20 can be processed as follows to obtain a broad area laser:

Definition of 50 μm wide Ti/Au stripes on the p$^{++}$-contact layer 19,

Formation of lateral contact pads on the n$^+$-GaAs contact layer 18 by chemical etching, Ni/Ge/Au metallization, and subsequent thermal annealing, Laser facets can be produced by cleaving after thinning the substrate 15.1 to 200 μm, for example.

Room temperature amplified spontaneous emission spectra were measured for continuous wave (CW) current injection at a current density of 50 A/cm$^2$. The spectrum for a laser grown in accordance with the present invention on a VS 15 and an identical reference laser grown on a conventional bulk Ge substrate have been compared. The peak wavelength is ~1.04 μm for both lasers.

The optical output power as a function of the drive current has been measured for an InGaAs/GaAs laser grown in accordance with the present invention on a VS 15. This is the first time that laser action at an emission wavelength above 1 μm has been demonstrated in a strained channel for a structure grown on a SiGe buffer layer 15.2. The threshold current amounts to 2 kA/cm$^2$. An identical reference laser grown on bulk Ge exhibits a threshold current of 500 A/cm$^2$.

The invention claimed is:

1. Method for making an InGaAs/GaAs quantum well laser (10) on a Silicon substrate (15.1), the method comprising the following steps:

formation of a virtual Germanium substrate (15) on the Silicon substrate (15.1) by means of a low-energy plasma-enhanced chemical vapour deposition (LEPECVD) process, whereby said virtual Germanium substrate (15) comprises a pure Germanium layer (15.3; 15.4), said Germanium layer (15.3; 15.4) having a thickness between 0.5 μm and 2 μm, formation of a Gallium Arsenide structure on the virtual Germanium substrate (15) by means of a metal organic chemical vapour deposition process, said metal organic chemical vapour deposition process comprising an initial step for the formation of a first Gallium Arsenide layer (16; 21) on said virtual Germanium substrate (15) at a first substrate temperature $(T_{s1})$, a second step for the formation of a second Gallium Arsenide waveguide layer (17) at a second substrate temperature $(T_{s2})$, said second substrate temperature $(T_{s2})$ being higher than said first substrate temperature $(T_{s1})$ and said first Gallium Arsenide layer (16; 21) being thinner than said second Gallium Arsenide layer (17), and subsequent steps for the formation of an active laser structure comprising a Gallium Arsenide waveguide layer (12) embedding a quantum well (11).

2. The method of claim 1, wherein said virtual Germanium substrate (15) further comprises a linearly graded Silicon Germanium buffer layer (15.2) with grading rate between 5 and 300%/μm formed underneath said pure Germanium layer (15.3).

3. The method of claim 2, wherein said initial step is an atomic layer epitaxy step and said first Gallium Arsenide layer (16) is an Arsenic/Gallium super-lattice.

4. The method of claim 2, wherein said second Gallium Arsenide waveguide layer (17) is undoped and has a thickness between 0.2-2 μm, and preferably about 1 μm.

5. The method of claim 2, wherein said Gallium Arsenide waveguide layer (12) is undoped and has a thickness between 0.2-0.4 μm, and preferably about 0.29 μm.

6. The method of claim 1, wherein said pure Germanium layer (15.3) is a cap layer preferably having a thickness of about 1 μm.

7. The method of claim 6, wherein the Si-wafer is [001]-oriented with a mis-orientation of 6 degree.

8. The method of claim 6, wherein said initial step is an atomic layer epitaxy step and said first Gallium Arsenide layer (16) is an Arsenic/Gallium super-lattice.

9. The method of claim 6, wherein said second Gallium Arsenide waveguide layer (17) is undoped and has a thickness between 0.2-2 µm. and preferably about 1 µm.

10. The method of claim 6, wherein said Gallium Arsenide waveguide layer (12) is undoped and has a thickness between 0.2-0.4 µm, and preferably about 0.29 µm.

11. The method of claim 1, wherein said pure Germanium layer (15.4) is formed directly on said Silicon substrate (15.1) and preferably has a thickness of 1 µm.

12. The method of claim 11, wherein said initial step is an atomic layer epitaxy step and said first Gallium Arsenide layer (16) is an Arsenic/Gallium super-lattice.

13. The method of claim 11 wherein said second Gallium Arsenide waveguide layer (17) is undoped and has a thickness between 0.2-2 µm, and preferably about 1 µm.

14. The method of claim 1, wherein said initial step is an atomic layer epitaxy step and said first Gallium Arsenide layer (16) is an Arsenic/Gallium super-lattice.

15. The method of claim 14 wherein said second Gallium Arsenide waveguide layer (17) is undoped and has a thickness between 0.2-2 µm, and preferably about 1 µm.

16. The method of claim 1, wherein said second Gallium Arsenide waveguide layer (17) is undoped and has a thickness between 0.2-2 µm, and preferably about 1 µm.

17. The method of claim 1, wherein said Gallium Arsenide waveguide layer (12) is undoped and has a thickness between 0.2-0.4 µm, and preferably about 0.29 µm.

18. The method of claim 1, comprising steps for the formation of
an $n^+$-doped GaAs contact layer (18),
an n-doped AlGaAs cladding layer (13),
a p-doped AlGaAs cladding layer (14), and
a $p^{++}$-doped contact layer (19),
these layers all being formed by the metal organic chemical vapour deposition process.

19. The method of claim 1, comprising several metal organic chemical vapour deposition process steps for the formation of said active laser structure, whereby the active laser structure is an InGaAs quantum well laser structure, and preferably an InGaAs/AlGaAs/GaAs quantum well laser structure with a compressively strained InGaAs quantum well (11).

20. The method of claim 1, wherein the low-energy plasma-enhanced chemical vapour deposition (LEPECVD) has a growth rate of up to 10 nm/s.

* * * * *